US012795827B2

(12) United States Patent
Kuwabara et al.

(10) Patent No.: US 12,795,827 B2
(45) Date of Patent: Nov. 10, 2026

(54) WIRING SUBSTRATE

(71) Applicant: IBIDEN CO., LTD., Ogaki (JP)

(72) Inventors: Masashi Kuwabara, Ibi-gun (JP); Susumu Kagohashi, Ogaki (JP); Jun Sakai, Ogaki (JP); Kyohei Yoshikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 207 days.

(21) Appl. No.: 18/643,279

(22) Filed: Apr. 23, 2024

(65) Prior Publication Data

US 2024/0365468 A1 Oct. 31, 2024

(30) Foreign Application Priority Data

Apr. 26, 2023 (JP) ................................ 2023-072725

(51) Int. Cl.
*H05K 1/11* (2006.01)
*H05K 1/03* (2006.01)

(52) U.S. Cl.
CPC ........... *H05K 1/115* (2013.01); *H05K 1/0306* (2013.01); *H05K 1/113* (2013.01); *H05K 2201/0209* (2013.01); *H05K 2201/0242* (2013.01); *H05K 2201/0266* (2013.01); *H05K 2201/09536* (2013.01); *H05K 2201/09827* (2013.01)

(58) Field of Classification Search
CPC ... H05K 2201/0209; H05K 2201/0242; H05K 2201/0266; H05K 2201/09536; H05K 2201/09827; H05K 1/115; H05K 1/113; H05K 1/0306
See application file for complete search history.

(56) References Cited

U.S. PATENT DOCUMENTS

2025/0294674 A1* 9/2025 Li ........................ H05K 1/0298
2025/0386433 A1* 12/2025 Yugawa ................. H05K 1/032

FOREIGN PATENT DOCUMENTS

JP 2021-019061 A 2/2021

* cited by examiner

*Primary Examiner* — Jeremy C Norris
(74) *Attorney, Agent, or Firm* — Finnegan, Henderson, Farabow, Garrett & Dunner, LLP

(57) ABSTRACT

A wiring substrate includes a first build-up part including an insulating layer and a conductor layer, and a second build-up part laminated on the first build-up part and including an insulating layer and a conductor layer. The minimum width and minimum inter-wiring distance of wirings in the first build-up part are smaller than the minimum width and minimum inter-wiring distance of wirings in the second build-up part. The insulating layer in the first build-up part includes resin and inorganic particles including first inorganic particles partially embedded in the resin and second inorganic particles completely embedded in the resin such that the first inorganic particles have first portions protruding from the resin and second portions embedded in the resin, respectively. The insulating layer of the first build-up part has a surface covered by the conductor layer and including a surface of the resin and exposed surfaces of the first portions.

20 Claims, 9 Drawing Sheets

WIRING SUBSTRATE

CROSS-REFERENCE TO RELATED APPLICATIONS

The present application is based upon and claims the benefit of priority to Japanese Patent Application No. 2023-072725, filed Apr. 26, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2021-19061 describes a printed wiring board that includes an interlayer insulating layer using a mixture of a thermosetting resin and an inorganic filler, and a seed layer and a plating layer formed on the interlayer insulating layer. The entire contents of this publication are incorporated herein by reference.

SUMMARY OF THE INVENTION

According to one aspect of the present invention, a wiring substrate includes a first build-up part including an insulating layer and a conductor layer, and a second build-up part laminated on the first build-up part and including an insulating layer and a conductor layer such that the minimum width of wirings in the conductor layer of the first build-up part is smaller than the minimum width of wirings in the conductor layer of the second build-up part, the minimum inter-wiring distance of the wirings in the conductor layer of the first build-up part is smaller than the minimum inter-wiring distance of the wirings in the conductor layer of the second build-up part. The insulating layer in the first build-up part includes resin and inorganic particles including first inorganic particles partially embedded in the resin and second inorganic particles completely embedded in the resin such that the first inorganic particles have first portions protruding from the resin and second portions embedded in the resin, respectively, and the first build-up part is formed such that the insulating layer has a surface covered by the conductor layer and including a surface of the resin and exposed surfaces of the first portions exposed from the resin.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
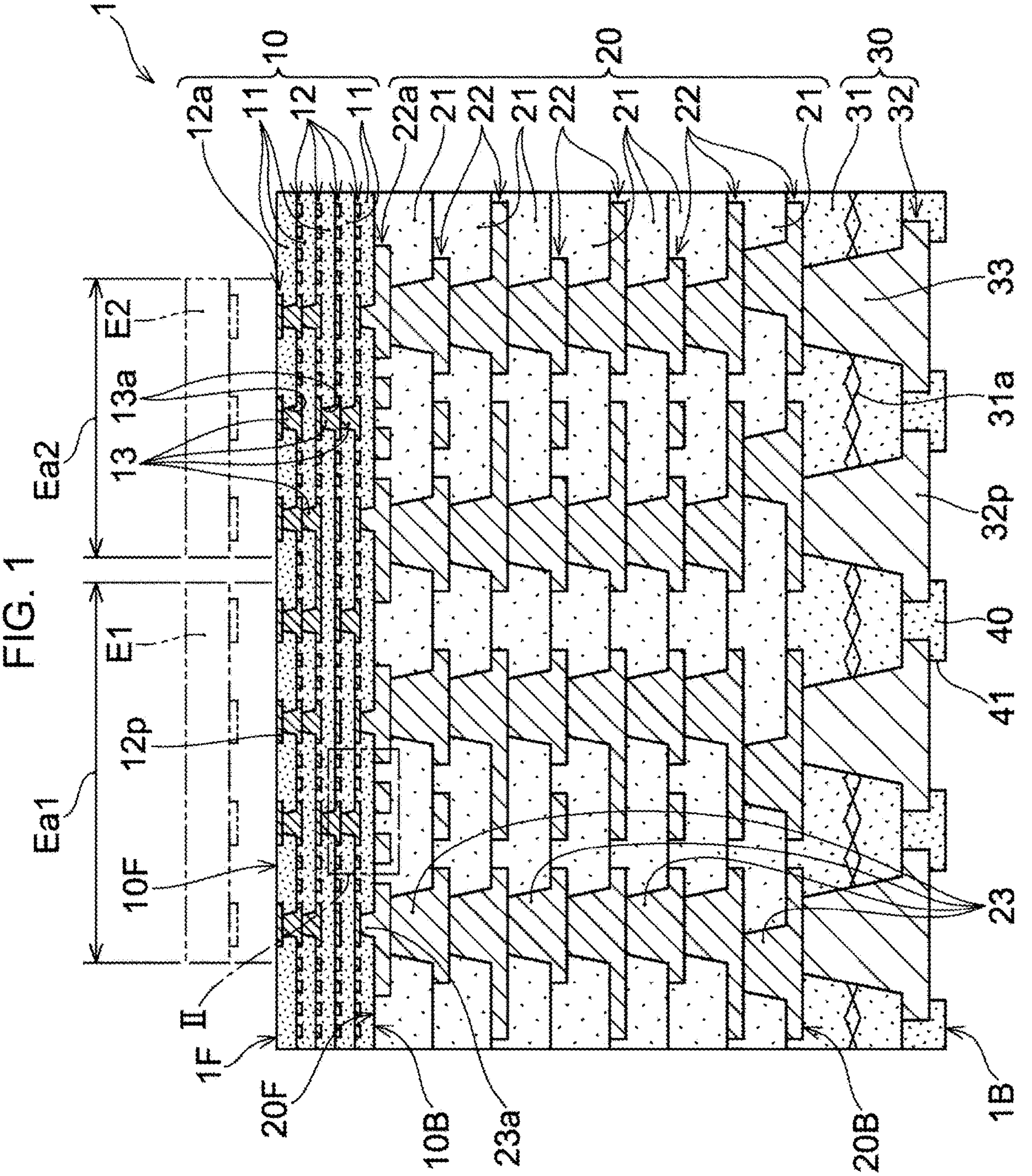
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Structure of Wiring Substrate

Figure 2:
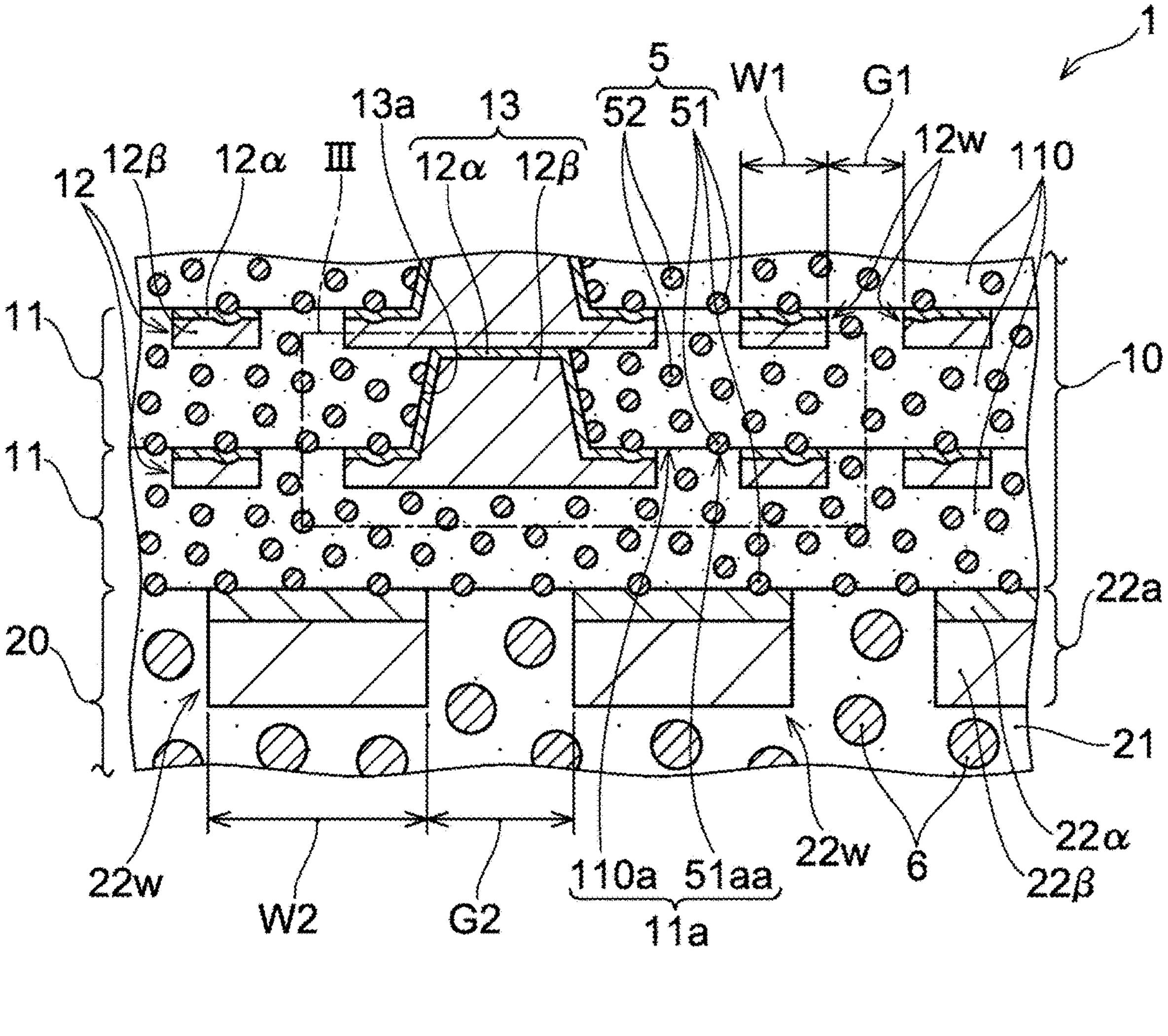
FIG. 2 is an enlarged view of a portion (II) of FIG. 1.

A wiring substrate according to an embodiment of the present invention is described with reference to the drawings. FIG. 1 illustrates a cross-sectional view of a wiring substrate 1, which is an example of a wiring substrate according to an embodiment of the present invention. FIG. 2 illustrates an enlarged view of a portion (II) of FIG. 1. The number and thicknesses of conductor layers and insulating layers, as well as conductor patterns in the conductor layers, in the wiring substrate of the present embodiment are not limited to the number and thicknesses of conductor layers and insulating layers, and the conductor patterns, in the wiring substrate 1 illustrated in FIG. 1.

As illustrated in FIGS. 1 and 2, the wiring substrate 1 has two surfaces (a first surface (1F) and a second surface (1B) on the opposite side with respect to the first surface (1F))

perpendicular to a thickness direction of the wiring substrate 1. The wiring substrate 1 includes a first build-up part 10 and a second build-up part 20. The first build-up part 10 is laminated on the first surface (1F) side of the second build-up part 20. A lamination direction of the first build-up part 10 and the second build-up part 20 is the thickness direction of the wiring substrate 1. The first build-up part 10 and the second build-up part 20 completely overlap each other. The wiring substrate 1 illustrated in FIG. 1 further includes a third build-up part 30, which is laminated on the second build-up part 20 on the second surface (1B) side of the wiring substrate 1, and a solder resist 40, which covers a surface of the third build-up part 30. The wiring substrate of the present embodiment can be a coreless wiring substrate that does not include a core layer, such as the wiring substrate 1 illustrated in FIG. 1.

In the description of the wiring substrate 1 of the present embodiment, the first surface (1F) side of the wiring substrate 1 is also referred to as "upper" or an "upper side," and the second surface (1B) side of the wiring substrate 1 is also referred to as "lower" or a "lower side." Further, for each of the structural elements, a surface facing the first surface (1F) side of the wiring substrate 1 is also referred to as an "upper surface," and a surface facing the second surface (1B) side of the wiring substrate 1 is also referred to as a "lower surface."

The first build-up part 10 has a first surface (10F), which is the same surface as the first surface (1F) of the wiring substrate 1, and a second surface (10B) which is on the opposite side with respect to the first surface (10F). The first build-up part 10 includes alternately laminated conductor layers 12 (first conductor layers) and insulating layers 11 (first insulating layers). Each conductor layer 12 is formed on a lower surface of an upper side adjacent insulating layer 11. The first build-up part 10 further includes a conductor layer (12*a*), which is a conductor layer closest to the first surface (1F) of the wiring substrate 1 in the first build-up part 10.

The conductor layer (12*a*) is embedded in an insulating layer 11 which is closest to the first surface (1F) of the wiring substrate 1 in the first build-up part 10, with an upper surface thereof exposed from the first surface (1F). The first surface (1F) of the wiring substrate 1 is formed by the exposed upper surface of the conductor layer (12*a*) and an upper surface of the insulating layer 11 in which the conductor layer (12*a*) is embedded.

The first surface (1F) of the wiring substrate 1 includes one or more component regions (a component region (Ea1) and a component region (Ea2) in the example of FIG. 1) on which mounting components (a component (E1) and a component (E2) in the example of FIG. 1) are mounted when the wiring substrate 1 is used. The first surface (1F) of the wiring substrate 1 can be a component mounting surface that is at least partially covered by mounting components such as the component (E1) and the component (E2) when the wiring substrate 1 is in use.

The conductor layers 12 and conductor layer (12*a*) each include any conductor patterns. The conductor layer (12*a*), which forms a component mounting surface in the first build-up part 10, includes component mounting pads (12*p*) formed of conductor pads. Each of the component mounting pads (12*p*) is embedded in the insulating layer 11 that forms the first surface (1F) of the wiring substrate 1, with one surface thereof exposed from the first surface (1F). The exposed surfaces of the component mounting pads (12*p*) can be connected to electrodes of a mounting component by, for example, a conductive bonding material such as solder (not illustrated). A surface treatment layer (not illustrated) formed of a plating layer or the like containing, for example, nickel, palladium, gold, or the like may be formed on the exposed surface of the component mounting pads (12*p*).

Examples of the components (E1, E2) that can be mounted on the wiring substrate 1 include electronic components such as active components such as semiconductor integrated circuit devices and transistors. As some examples, the components (E1, E2) can each be an integrated circuit device such as a logic chip, a processing device such as an MPU (Micro Processor Unit), or a memory device such as an HBM (High Bandwidth Memory).

The first build-up part 10 further includes via conductors 13 (first via conductors) penetrating the insulating layers 11. The via conductors 13 are formed in openings (13*a*) penetrating the insulating layers 11. Each via conductor 13 connects a conductor layer 12 below an insulating layer 11 that includes the each via conductor 13 to a conductor layer 12 or the conductor layer (12*a*) above the insulating layer 11. Each via conductor 13 is integrally formed with a conductor layer 12 that is in contact with an end of the each via conductor 13 on the second surface (1B) side of the wiring substrate 1.

The second build-up part 20 has a first surface (20F), which is a surface on the first surface (1F) side of the wiring substrate 1, and a second surface (20B), which is a surface on the opposite side with respect to the first surface (20F). The first surface (20F) of the second build-up part 20 faces the second surface (10B) of the first build-up part 10. The second build-up part 20 includes alternately laminated conductor layers 22 and insulating layers 21 (second insulating layers), as well as via conductors 23 (second via conductors) penetrating the insulating layers 21. The second build-up part 20 further includes a conductor layer (22*a*) (second conductor layer), which is a conductor layer closest to the first surface (20F) in the second build-up part 20, and via conductors (23*a*). The via conductors (23*a*) are integrally formed with the conductor layer (22*a*), and penetrate the insulating layer 11 closest to the second build-up part 20 in the first build-up part 10. The first surface (20F) of the second build-up part 20 is formed by an upper surface of the insulating layer 21 positioned closest to the first build-up part 10 among the multiple insulating layers 21, and an upper surface of the conductor layer (22*a*).

On the other hand, the second surface (20B) of the second build-up part 20 is formed by lower surfaces of the insulating layer 21 and conductor layer 22 that are positioned closest to the second surface (1B) of the wiring substrate 1 in the second build-up part 20. In the wiring substrate 1 illustrated in FIG. 1, the second surface (20B) of the second build-up part 20 faces a surface (upper surface) of the third build-up part 30 on the first surface (1F) side of the wiring substrate 1.

The conductor layers 22 and conductor layer (22*a*) each include any conductor patterns. Each of the conductor layers 22 and conductor layer (22*a*) is formed on a lower surface of an upper side adjacent insulating layer 21 or insulating layer 11. Each via conductor 23 connects a conductor layer 22 below an insulating layer 21 that includes the each via conductor 23 to a conductor layer 22 or the conductor layer (22*a*) above the insulating layer 21. The via conductors (23*a*) connects the conductor layer (22*a*) to a conductor layer 12 in first build-up part 10.

The third build-up part 30 includes laminated insulating layer 31 (third insulating layer) and conductor layer 32 (third conductor layer), and via conductors 33 (third via conductors). The conductor layer 32 includes any conductor patterns, such as conductor pads (32*p*). The via conductors 33 connects the conductor layer 32 to a conductor layer 22 included in the second build-up part 20.

The solder resist 40 is formed on surfaces of the insulating layer 31 and conductor layer 32 on the second surface (1B) side of the wiring substrate 1. Openings 41 are formed in the solder resist 40, and the conductor pads (32*p*) are exposed in the openings 41. The solder resist 40 is formed using, for example, a photosensitive polyimide resin or epoxy resin.

In the example of FIG. 1, the second surface (1B) of the wiring substrate 1 is formed of a surface of the solder resist 40 on the second surface (1B) side of the wiring substrate 1 and an exposed surface of the conductor layer 32 exposed from the solder resist 40. However, the wiring substrate of the present embodiment does not necessarily include the third build-up part 30 and/or the solder resist 40. For a wiring substrate of an embodiment that does not include the third build-up part 30, the second surface is either the second surface (20B) of the second build-up part 20, or is formed of a solder resist formed on the second surface (20B) of the second build-up part 20 and exposed portions of the second surface (20B) from the solder resist.

The second surface (1B) of the wiring substrate 1 can be a connecting surface to be connected to an external element such as an external wiring substrate (for example, a motherboard of any electrical device) when the wiring substrate 1 itself is mounted on the external element. In the example of FIG. 1, the conductor pads (32*p*) of third build-up part 30 can be connected to any substrate, electrical component, mechanical component, or the like.

The insulating layers 11, insulating layers 21, and insulating layer 31 can be formed, for example, using a thermosetting insulating resin such as an epoxy resin, a bismaleimide triazine resin (BT resin), or a phenol resin. The insulating layers (11, 21, 31) may also be formed using a thermoplastic insulating resin such as a fluororesin, a liquid crystal polymer (LCP), a fluorinated ethylene resin (PTFE), a polyester resin (PE), or a modified polyimide resin (MPI). The insulating layers (11, 21, 31) may contain the same insulating resin or may contain mutually different insulating resins.

The insulating layers (11, 21, 31) may contain a core material (reinforcing material) formed of a glass fiber or the like. In the example of FIG. 1, the insulating layer 31 contains a core material (31*a*). The core material (31*a*) may provide the wiring substrate 1 with adequate rigidity. The core material (31*a*) can be, for example, a glass fiber or an aramid fiber. On the other hand, an insulating layer that does not include a core material such as a glass fiber may facilitate formation of fine wirings on a surface thereof or enhance adhesion with a conductor layer. In the example of FIG. 1, the insulating layers 11 and the insulating layers 21 do not contain any core material.

Although omitted in FIG. 1, the insulating layers (11, 21, 31) may further contain inorganic particles added as a filler to an insulating resin forming the insulating layers (11, 21, 31). The insulating layers containing inorganic particles are, for example, imparted with low thermal expansion coefficients or high thermal conductivities. In the wiring substrate 1 of the present embodiment, as illustrated in FIG. 2, the insulating layers 11 of the first build-up part 10 contain multiple inorganic particles 5 and an insulating resin 110 such as the above-described epoxy resin. A content of the inorganic particles 5 in the insulating layers 11 is, for example, 75 wt % or more. In the example of FIG. 2, the insulating layers 21 included in the second build-up part 20 contain inorganic particles 6. The inorganic particles 5 and inorganic particles 6 are fine particles formed of, for example, silica ($SiO_2$), alumina, mullite, or the like.

In the example of FIG. 2, a maximum particle size of the inorganic particles 5 is smaller than a maximum particle size of the inorganic particles 6. A "particle size" of each of the inorganic particles (5, 6) is a maximum distance between two points on a surface of each inorganic particle. For example, the maximum particle size of the inorganic particles 5 is 1 μm or less, and an average particle size of the inorganic particles 5 is 0.5 μm or less. On the other hand, the maximum particle size of the inorganic particles 6 is, for example, 4 μm or less. When the particle sizes of the inorganic particles (5, 6) are small, even between wirings formed at fine pitches in the conductor layers in contact with the insulating layers, a short circuit failure due to a leakage path along inorganic particles or the like is unlikely to occur. Further, formation of small-sized via conductors may be facilitated. The first build-up part 10 containing the inorganic particles 5 with smaller particle sizes can have good reliability regarding insulation between wirings and can include wirings formed at fine pitches.

The conductor layers (12, 12*a*) and via conductors 13, the conductor layers (22, 22*a*) and via conductors (23, 23*a*), and conductor layer 32 and via conductors 33, can be formed, for example, using any metal such as copper or nickel having appropriate conductivity. In FIG. 1, the conductor layers and the via conductors are each depicted as having a single-layer structure. However, the conductor layers and the via conductors can each have a multilayer structure, as illustrated for the conductor layers (12, 22*a*) and via conductors 13 in FIG. 2.

In the example of FIG. 2, the conductor layers 12 (and the conductor layer (12*a*) not illustrated in FIG. 2), as well as the via conductors 13, are each formed of a first layer (12α) positioned on the first surface (1F) side (see FIG. 1) of the wiring substrate 1, and a second layer (12β) formed on a surface (lower surface) of the first layer (12α) on the second surface (1B) side (see FIG. 1) of the wiring substrate 1. The second layer (12β) can be, for example, an electrolytic plating film layer formed of a metal film formed by electrolytic plating. The first layer (12α) can be a seed layer that can be used as a power feeding layer when the second layer (12β) is formed by electrolytic plating. The first layer (12α) can have a thickness of, for example, 0.2 μm or more and less than 0.5 μm. When the thickness of the first layer (12α) is less than 0.5 μm, conductor residues are unlikely to occur during etching, and thus, a short circuit failure is unlikely to occur in the conductor layers 12.

The conductor layer (22*a*) (and the conductor layers 22 and via conductors (23, 23*a*) not illustrated in FIG. 2) includes a first layer (22α), and a second layer (22β), which is formed on a lower surface of the first layer (22α) and can be an electrolytic plating film layer. The first layer (22α) is used as a power feeding layer when the second layer (22β) is formed. The first layers (12α, 22α) are each formed of, for example, a sputtering film or an electroless plating film. When the first layers (12α, 22α) are sputtering films, good adhesion can be obtained between each conductor layer and an insulating layer 11 or insulating layer 21. When the first layers (12α, 22α) are each formed of a sputtering film, although not illustrated, the first layers (12α, 22α) can each include, for example, a first film formed of a copper alloy on the first surface (1F) side of the wiring substrate 1 and a second film formed of substantially copper on the second surface (1B) side.

For example, the first layer (12α) of each of the conductor layers 12 included in the first build-up part 10 may be a sputtering film, and the first layer (22α) of each of the conductor layers (22, 22*a*) included in the second build-up part 20 may be an electroless plating film. It may be possible that adhesion strength between the insulating layers 11 and the conductor layers 12 in the first build-up part 10 is sufficiently high. Further, it may be possible that, in forming the second build-up part 20, the conductor layers (22, 22*a*) can be easily formed.

Although not illustrated in FIG. 2, the conductor layer 32 and via conductors 33 can each have a layer formed of the same material as the first layer (22α) of the conductor layers 22, and a layer formed of the same material as the second layer (22β). The conductor layer 32 may further include a layer formed of a metal foil positioned on the insulating layer 31 of the two layers.

As illustrated in FIG. 1, the via conductors (13, 23, 23*a*, 33) all have a tapered shape that is reduced in diameter from the second surface (1B) toward the first surface (1F) of the wiring substrate 1. Since the via conductors (13, 23, 23*a*, 33) have such a tapered shape, it may be possible that a conductor layer closer to the first surface (1F), which can serve as a component mounting surface, can include wirings formed at a finer pitch. A shape of a horizontal cross section (a cross section perpendicular to the thickness direction of the wiring substrate 1) of each of the via conductors (13, 23, 23*a*, 33) is not necessarily limited to a circular shape. The term "reduced in diameter" means that a longest distance between two points on an outer circumference of a horizontal cross section of each via conductor (hereinafter this distance is also referred to as the "width" of each via conductor) is reduced.

Each via conductor 13 included in the first build-up part 10 has, for example, an aspect ratio ((the distance between the upper surface of a lower conductor layer 12 to which the via conductor 13 is connected and the lower surface of an upper conductor layer 12 or the conductor layer (12*a*))/(the width of the via conductor 13 at the upper surface of the lower conductor layer 12)) of 0.5 or more and 1.0 or less. It may be possible that the first build-up part 10 can include wirings formed at fine pitches and via conductors 13 that are unlikely to break and have low conductor resistance. The width of each via conductor 13 at the upper surface of the lower conductor layer 12 is, for example, about 10 μm. On the other hand, in the second build-up part 20, the width of each via conductor 23 at the upper surface of the lower conductor layer 22 is about 50 μm.

As described above, the conductor layers included in the build-up parts can include any conductor patterns. As illustrated in FIG. 2, the conductor layers 12 include wirings (12*w*) as conductor patterns, and the conductor layer (22*a*) includes wirings (2*w*). Each of the wirings (12*w*) has a wiring width (W1) as a width thereof. The wirings (12*w*) have an inter-wiring distance (G1) as a distance between adjacent wirings (12*w*). The wiring width (W1) is a minimum width among wiring widths of the wirings included in the conductor layer (12*a*) or conductor layers 12 of the first build-up part 10. Further, the inter-wiring distance (G1) is a minimum distance among inter-wiring distances of the wirings included in the conductor layer (12*a*) or conductor layers 12 of the first build-up part 10.

On the other hand, each of the wirings (22*w*) has a wiring width (W2) as a width thereof. The wirings (22*w*) have an inter-wiring distance (G2) as a distance between adjacent wirings (22*w*). The wiring width (W2) is a minimum width among wiring widths of the wirings included in the conductor layer (22*a*) or conductor layers 22 of the second build-up part 20. Further, the inter-wiring distance (G2) is a minimum distance among inter-wiring distances of the wirings included in the conductor layer (22*a*) or conductor layers 22 of the second build-up part 20. As illustrated in FIG. 2, the wiring width (W1) and the wiring width (W2) are different from each other. Further, the inter-wiring distance (G1) and the inter-wiring distance (G2) are different from each other.

In this way, in the wiring substrate of the embodiment, the conductor layers 12 that form the first build-up part 10 together with the insulating layers 11 can include wirings formed according to wiring rules different from the wirings of the conductor layers included in the second build-up part 20.

In the wiring substrate 1 of the embodiment, the first build-up part 10 can be a laminate of such conductor layers 12 and insulating layers 11. The wiring substrate 1 of the present embodiment that includes the second build-up part 20 and the first build-up part 10, which includes conductor layers different from the conductor layers of the second build-up part 20 in terms of the minimum wiring width and minimum inter-wiring distance, can include fine wirings only in the necessary conductor layers. Further, the wiring substrate 1 of the embodiment can include other conductor layers as conductor layers that include wirings that have wider wiring widths or inter-wiring distances and are easier to form.

In the wiring substrate 1 of the present embodiment, the minimum width (in the example of FIG. 2, the wiring width (W1)) of the wirings included in the conductor layers 12 or conductor layer (12*a*) of the first build-up part 10 is smaller than the minimum width (in the example of FIG. 2, the wiring width (W2)) of the wirings included in the conductor layer (22*a*) or conductor layers 22 of the second build-up part 20. Further, in the wiring substrate 1 of the embodiment, the minimum inter-wiring distance (in the example of FIG. 2, the inter-wiring distance (G1)) of the wirings included in the conductor layer (12*a*) or conductor layers 12 of the first build-up part 10 is smaller than the minimum inter-wiring distance (in the example of FIG. 2, the inter-wiring distance (G2)) of the wirings included in the conductor layers 22 or conductor layer (22*a*) of the second build-up part 20. For example, the minimum width of the wirings included in the conductor layers 12 can be 1 μm or more and 3 μm or less, and the minimum inter-wiring distance the wirings included in the conductor layers 12 can be 1 μm or more and 3 μm or less. Since the first build-up part 10 is formed by the conductor layers 12 including wirings formed at such a fine pitch, it may be possible that wirings having more suitable characteristics corresponding to electrical signals transmitted by the wirings in the first build-up part 10 can be provided. Further, it may be possible that a density of the wirings in the first build-up part 10 is high and thus a compact wiring substrate 1 can be obtained.

The minimum wiring width of the wirings included in conductor layers such as the conductor layer (22*a*) or conductor layers 22 forming the second build-up part 20 can be, for example, about 4 μm, and the minimum inter-wiring distance can be, for example, about 6 μm. It may be possible that the formation of the conductor layers of the second build-up part 20 is easy.

In the wiring substrate 1 of the embodiment, the aspect ratio of the wirings such as the wirings (12*w*) included in the conductor layers 12 of the first build-up part 10 can be, for example, 2.0 or more and 4.0 or less. Wirings having such an aspect ratio can have a low conductor resistance despite the small wiring width, and thus can serve as a signal transmission path with low insertion loss. For example, it may be possible that signals can be propagated between components mounted on the wiring substrate 1 with little transmission loss. Further, it may be possible that a desired characteristic impedance can be easily obtained, and thus, the insertion loss can be further reduced.

In the example of FIGS. 1 and 2, thicknesses of the conductor layers 12 are different from thicknesses of the conductor layers 22 and the conductor layer (22*a*). Further, thicknesses of the insulating layers 11 are different from thicknesses of the insulating layers 21. In this way, in the present embodiment, the first build-up part 10 may be a laminate of conductor layers and insulating layers, with the conductor layers having thicknesses different from the thicknesses of the conductor layers in the second build-up part 20. Further, in the present embodiment, the first build-up part 10 may be a laminate of insulating layers and conductor layers, with the insulating layers having thicknesses different from the thicknesses of the insulating layers in the second build-up part 20. Further, as described above, the particle sizes of the inorganic particles 5 contained in the insulating layers 11 are different from the particle sizes of the inorganic particles 6 contained in the insulating layers 21. Therefore, in the present embodiment, the first build-up part 10 may be a laminate of insulating layers and conductor layers, with the insulating layers being formed of a material different from a material of the insulating layers in the second build-up part 20.

In the wiring substrate 1, a conductor layer such as a conductor layer 12 included in the first build-up part 10 can have a thickness of, for example, 4 μm or more and 7 μm or less. It may be advantageous for forming the wirings (12*w*) and the like at fine pitches as etching residues and the like are unlikely to occur during manufacturing. The thicknesses of the insulating layers 11 included in the first build-up part 10 can be, for example, about 7.5 to 10 μm. On the other hand, the thicknesses of the conductor layers such as the conductor layers (22, 22*a*) included in the second build-up part 20 can be 10 μm or more and less than 20 μm. Further, the thicknesses of the insulating layers such as the insulating layers 21 included in the second build-up part 20 can be 20 μm or more and less than 100 μm.

The surfaces of the conductor layers 12 in the first build-up part 10 on the second build-up part 20 side (the second surface (1B) side of the wiring substrate 1) can be polished surfaces finished by polishing. In the example of FIG. 1, the surfaces of all four conductor layers 12 on the second surface (1B) side are polished surfaces. A polished surface can have, for example, a lower surface roughness than that of a plating film formed as it is by metal deposition. Therefore, it is thought that, in wirings included in each conductor layer 12 having a polished surface, deterioration in signal transmission characteristics or an increase in voltage drop is unlikely to occur. For example, a polished surface that each conductor layer 12 has as a surface on the second surface (1B) side can have an arithmetic mean roughness of 0.3 μm or less. When such a surface roughness is obtained, it may be possible that the effect described above regarding the transmission characteristics can be obtained.

Although not illustrated, in the wiring substrate 1 of FIG. 1, wiring widths of wirings of the conductor layer 32 included in the third build-up part 30 are larger than the wiring widths of the wirings such as the wirings (22*w*) included in the second build-up part 20. Further, inter-wiring distances of the wirings of the conductor layer 32 are larger than the inter-wiring distances of the wirings included in the second build-up part 20. Further, the insulating layer 31 and the conductor layer 32 in the third build-up part 30 are both formed thicker than the insulating layers 21 and the conductor layers (22, 22*a*) in the second build-up part 20. For example, the thickness of the insulating layer 31 is about 100 μm or more and 200 μm or less. Further, the thickness of the conductor layer 32 is about 20 μm. A width of each via conductor 33 formed in the insulating layer 31 (a width on an upper surface of the conductor layer 32) is about 100 μm.

Figure 3:
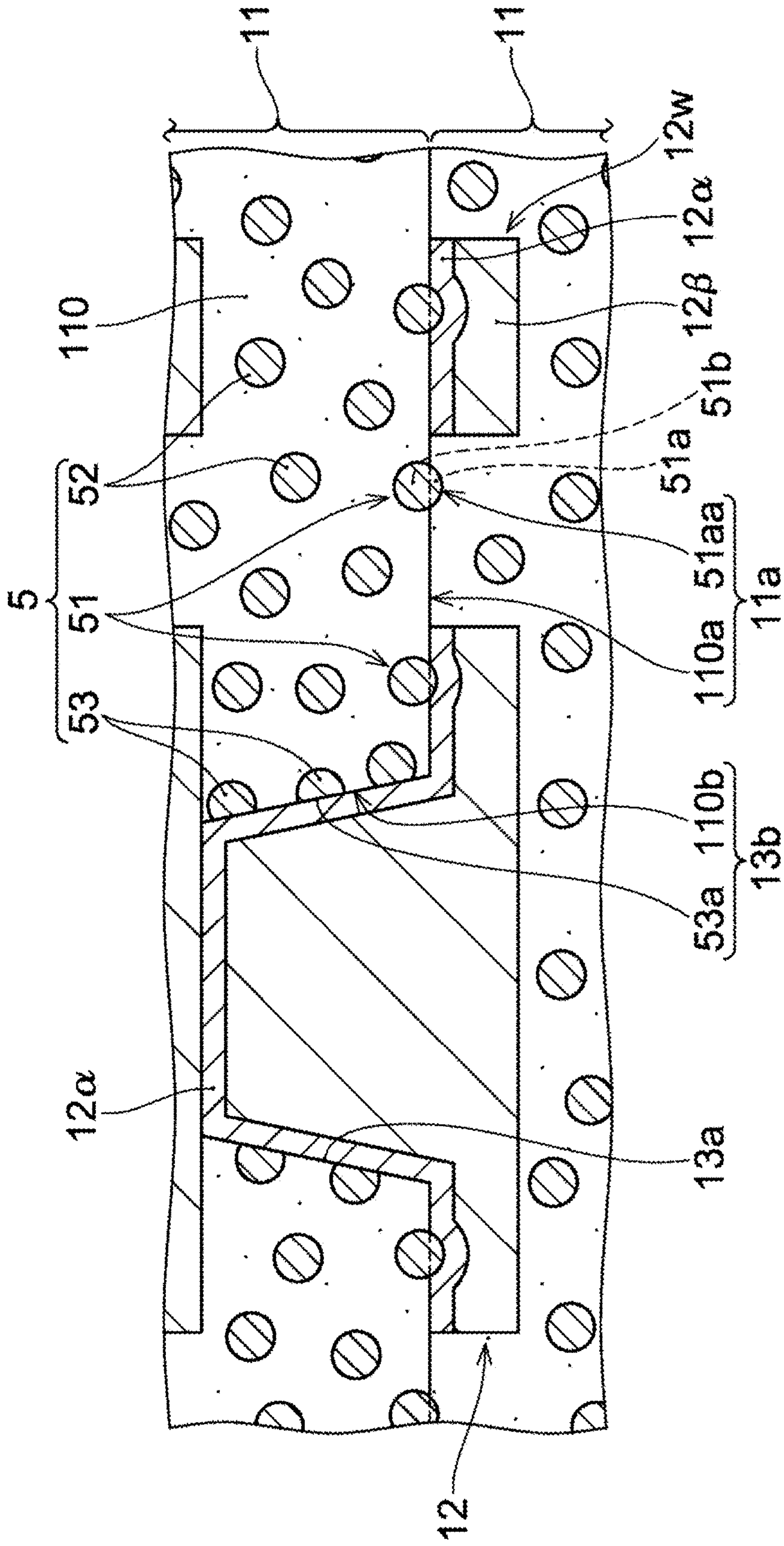
FIG. 3 is an enlarged view of a portion (III) of FIG. 2.

FIG. 3 illustrates an enlarged view of a portion (III) of FIG. 2. With reference to FIG. 3 in addition to FIG. 2, the resin 110 and the multiple inorganic particles 5 forming the insulating layers 11 of the first build-up part 10 are further described. As illustrated in FIGS. 2 and 3, in the wiring substrate 1 of the present embodiment, the multiple inorganic particles 5 include first inorganic particles 51 and second inorganic particles 52. The first inorganic particles 51 and the second inorganic particles 52 each have a spherical shape. The first inorganic particles 51 are inorganic particles among the multiple inorganic particles 5 that are partially embedded in the resin 110 corresponding to the individual inorganic particles 5. On the other hand, the second inorganic particles 52 are inorganic particles among the multiple inorganic particles 5 that are entirely embedded in the resin 110 corresponding to the individual inorganic particles 5. The "corresponding resin 110" means the resin 110 that forms the insulating layers 11 and contains most of the inorganic particles 5 of interest.

As illustrated in FIG. 3, the first inorganic particles 51 are each formed of a first portion (51*a*) protruding from the resin 110 and a second portion (51*b*) embedded in the resin 110. Then, a surface (11*a*) of each of the insulating layers 11 covered by a conductor layer 12 (for example, a lower surface, which is a surface of the each of the insulating layers 11 on the second build-up part 20 side) is formed by a surface (110*a*) of the resin 110 (for example, a lower surface of the resin 110 facing the second build-up part 20 side) and exposed surfaces (51*aa*) of the first portions (51*a*) of the first inorganic particles 51 exposed from the surface (110*a*) of the resin 110.

When the first portions (51*a*) protrude from the resin 110, the surface (11*a*) of each of the insulating layers 11 has slight unevenness. However, as will be described later, the surface (110*a*) of the resin 110 is not intentionally roughened during a manufacturing process of the wiring substrate 1. Therefore, the surface (11*a*) of each of the insulating layers 11 has substantially no recesses. An arithmetic mean roughness (Ra) of the surface (11*a*) of each of the insulating layers 11 (the surface on the second build-up part 20 side) is, for example, less than 0.08 μm. The arithmetic mean roughness (Ra) of the surface (11*a*) is preferably 0.05 μm or less, and more preferably 0.03 μm or less.

In the example of FIG. 3, the first inorganic particles 51 that overlap with the conductor patterns of the conductor layers 12 are covered by the first layer (12α) of the conductor layers 12 and are not exposed from the first layer (12α). Therefore, a second layer (12β) without pinholes or bubbles can be formed by electrolytic plating. Similarly, in the example of FIG. 2, the first inorganic particles 51 that overlap with the conductor patterns of the conductor layer (22*a*) are covered by the first layer (22α) of the conductor layer (22*a*) and are not exposed from the first layer (22α). Therefore, a second layer (22β) without pinholes or bubbles can be formed by electrolytic plating.

A ratio (R) of a volume of the first portions (51*a*) of the first inorganic particles 51 to a volume of the first inorganic particles 51 ((volume of the first portions (51*a*))/(total volume of the first inorganic particles 51) can be, for example, larger than 0 and 0.4 or less. The ratio (R) is preferably 0.2 or less. The ratio (R) is more preferably 0.1 or less. The ratio (R) is most preferably 0.05 or less. The ratio (R) can be calculated, for example, using a cross-sectional view such as the one illustrated in FIG. 3 obtained by cutting the wiring substrate 1 along a plane perpendicular to the surface (11*a*) of each of the insulating layers 11. That is, using a cross-sectional view such as the one illustrated in FIG. 3, a cross-sectional area (51*a*S) of the first portions (51*a*) and a cross-sectional area (51S) of the entire first inorganic particles 51 are determined. Then, the ratio (R) may be represented by a ratio of the cross-sectional area (51*a*S) to the cross-sectional area (51S) ((cross-sectional area (51*a*S))/(cross-sectional area (51S))). When at least the first portions (51*a*) are less than half of the first inorganic particles 51, the area ratio of the first portions (51*a*) to the entire first inorganic particles 51 cannot be smaller than the volume ratio. That is, when the area ratio is 0.4 or less, the volume ratio is also 0.4 or less. Therefore, in evaluating the volume ratio (R), the ratio (R) may be represented by the area ratio.

For example, in evaluating the ratio (R), when 50 first inorganic particles 51 are observed and the ratio (R) for all the first inorganic particles 51 is larger than 0 and 0.4 or less, the ratio (R) for the wiring substrate to be evaluated is determined to be larger than 0 and 0.4 or less.

As illustrated in FIG. 3, the inorganic particles 5 further include third inorganic particles 53 that form an inner wall surface (13*b*) of each of the openings (13*a*) that penetrate the insulating layers 11. The third inorganic particles 53 each have a spherical segment shape. The shape of each of the third inorganic particles 53 can be obtained by cutting a sphere with a plane. The third inorganic particles 53 can have shapes obtained by cutting the second inorganic particles 52 with a plane. The third inorganic particles 53 and the second inorganic particles 52 are different in shape. The third inorganic particles 53 each have a flat part (53*a*). The flat parts (53*a*) form the inner wall surface (13*b*) of each of the openings (13*a*). The inner wall surface (13*b*) is formed by the third inorganic particles 53 and the resin 110. More specifically, the inner wall surface (13*b*) is formed by a surface (110*b*) of the resin 110 exposed to the each of the openings (13*a*) and the flat parts (53*a*) of the third inorganic particles 53. The flat parts (53*a*) and the surface (110*b*) of the resin 110 are substantially flush with each other. No unevenness is formed on the surface (110*b*) of the resin 110 forming the inner wall surface (13*b*). The surface (110*b*) of the resin 110 is substantially smooth. Also no unevenness is formed on exposed surfaces (surfaces forming the inner wall surface (13*b*)) of the flat parts (53*a*). The exposed surfaces of the flat parts (53*a*) are also substantially smooth. Therefore, the inner wall surface (13*b*) is substantially smooth. An arithmetic mean roughness (Ra) of the inner wall surface (13*b*) can be 1.0 μm or less.

In the wiring substrate 1 of the present embodiment, in this way, the surface (11*a*) of each of the insulating layers 11 of the first build-up part 10 is formed by the surface (110*a*) of the resin 110 and the exposed surfaces (51*aa*) of the first portions (51*a*) of the first inorganic particles 51 protruding from the surface (110*a*) of the resin 110. The surface (11*a*) of each of the insulating layers 11 has no recesses. Therefore, when the first layer (seed layer) (12α) of the conductor layers 12 is formed on the surface (11*a*) by sputtering, a continuous first layer (12α) is formed even if the sputtering film is thin. Therefore, the first layer (12α) can be formed thin. When the first layer (12α) is thin, for example, in the formation of the conductor layers 12 using a semi-additive method, after the formation of the second layer (12β) by pattern plating, an unwanted portion of the first layer (12α) is reliably removed, for example, by etching. Therefore, a short circuit failure is unlikely to occur even between fine conductor patterns such as the wirings (12*w*). Further, an etching amount during the removal of the first layer (12α) is small, and thus an etching time is short. Therefore, an etching amount of the second layer (12β) exposed to an etching solution during the etching is small. The conductor layers 12 can have fine wirings such as the wirings (12*w*) with widths as designed. Therefore, the wiring substrate 1 can have high quality.

Further, in the example of FIG. 3, the inner wall surface (13*b*) of each of the openings (13*a*) penetrating the insulating layers 11 is formed by the flat parts (53*a*) of the third inorganic particles 53 and the resin 110. As described above, the inner wall surface (13*b*) is formed smooth. Therefore, the first layer (12α) with a uniform thickness can be formed in the openings (13*a*), and consequently, the first layer (12α) can be formed thin even on the inner wall surface (13*b*) of each of the openings (13*a*). Therefore, a short circuit failure is even more unlikely to occur between fine conductor patterns such as the wirings (12*w*). The conductor layers 12 can even more easily have wirings such as the wirings (12*w*) with widths as designed. Consequently, the wiring substrate 1 can have even higher quality.

Next, with reference to FIGS. 4A-4M, an example of a method for manufacturing the wiring substrate of the present embodiment is described using a case where the wiring substrate 1 illustrated in FIG. 1 is manufactured as an example. Unless there is a description different from the description provided above regarding the materials of the structural elements of the wiring substrate 1, the structural elements can be formed using any of the materials described above with respect to the structural elements.

Figure 4A:
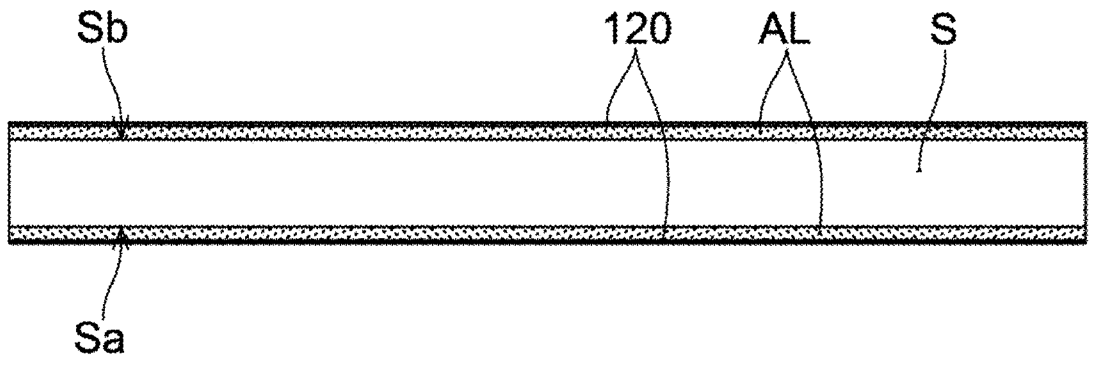
FIG. 4A is a cross-sectional view illustrating an example of a process for manufacturing a wiring substrate according to an embodiment of the present invention.

As illustrated in FIG. 4A, for example, a support substrate (S), which is a glass substrate, is prepared. An adhesive layer (AL) containing a photoplastic azobenzene polymer adhesive is formed by coating or laminating or the like on surfaces of the support substrate(S). Then, a metal film layer 120 formed of, for example, copper, nickel, or the like is formed on the adhesive layer (AL) by electroless plating, sputtering, or the like, or by pasting a metal foil using the adhesive layer (AL). The support substrate(S) has a first surface (Sa) and a second surface (Sb). In FIGS. 4B-4M to be referenced below, illustration of the second surface (Sb) side is omitted, and only the first surface (Sa) side is illustrated. However, a wiring substrate 1 may also be formed on the second surface (Sb) side by performing the same processing as on the first surface (Sa) side.

Figure 4B:
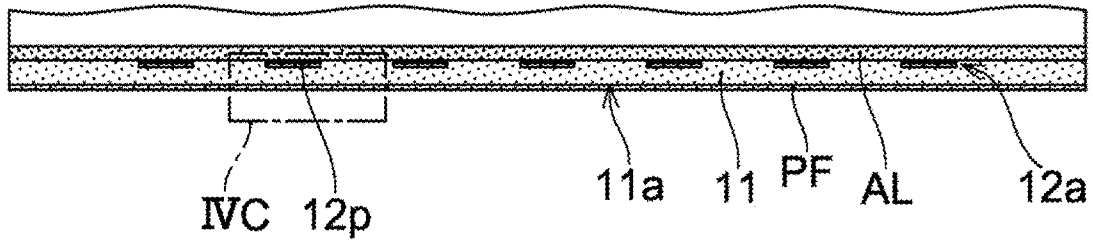
FIG. 4B is a cross-sectional view illustrating an example of a process for manufacturing a wiring substrate according to an embodiment of the present invention.

As illustrated in FIG. 4B, a conductor layer (12*a*) including conductor pads (component mounting pads (12*p*)) is formed on the adhesive layer (AL). In the formation of the conductor layer (12*a*), on the metal film layer 120 illustrated in FIG. 4A, a plating resist (not illustrated) having openings corresponding to formation regions of conductor patterns to be included in the conductor layer (12*a*) is formed by laminating a dry film and performing exposure and development. Then, the conductor layer (12*a*) is formed by electrolytic plating using the metal film layer 120 as a power feeding layer. After that, the plating resist is removed, and further, a portion of the metal film layer 120 exposed due to the removal of the plating resist is removed by etching or the like. The conductor layer (12*a*) in the state illustrated in FIG. 4B is obtained.

Further, an insulating layer 11 covering the conductor layer (12*a*) is formed. The insulating layer 11 is formed, for example, by laminating and thermocompression bonding a film-like epoxy resin on the conductor layer (12*a*). As described above, the insulating layer 11 (as well as the insulating layers 21 and insulating layer 31 to be formed in subsequent processes (see FIGS. 4L and 4M)) can be formed using not only an epoxy resin but also a thermosetting resin such as a BT resin or a phenolic resin, or a thermoplastic resin such as a fluorine resin or LCP. For example, a film-like resin containing inorganic particles 5 (see FIG. 4C) formed of silica ($SiO_2$), alumina or mullite or the like and an insulating resin 110 (see FIG. 4C) formed of an epoxy resin, a phenol resin, or the like described above, is used. In the state illustrated in FIG. 4B, all the inorganic particles 5 contained in the insulating layer 11 can be the second inorganic particles 52 (see FIG. 4C).

On a surface (lower surface) (11*a*) of the insulating layer 11, a protective film (PF) formed of a polyethylene terephthalate (PET) film or the like is provided. For example, in the formation of the insulating layer 11, a film-like resin having the protective film (PF) is laminated. The protective film (PF) may be adhered to the insulating layer 11 or a film-like resin forming the insulating layer 11 via a release agent (not illustrated) or the like for easy removal of the protective film (PF).

Figure 4C:
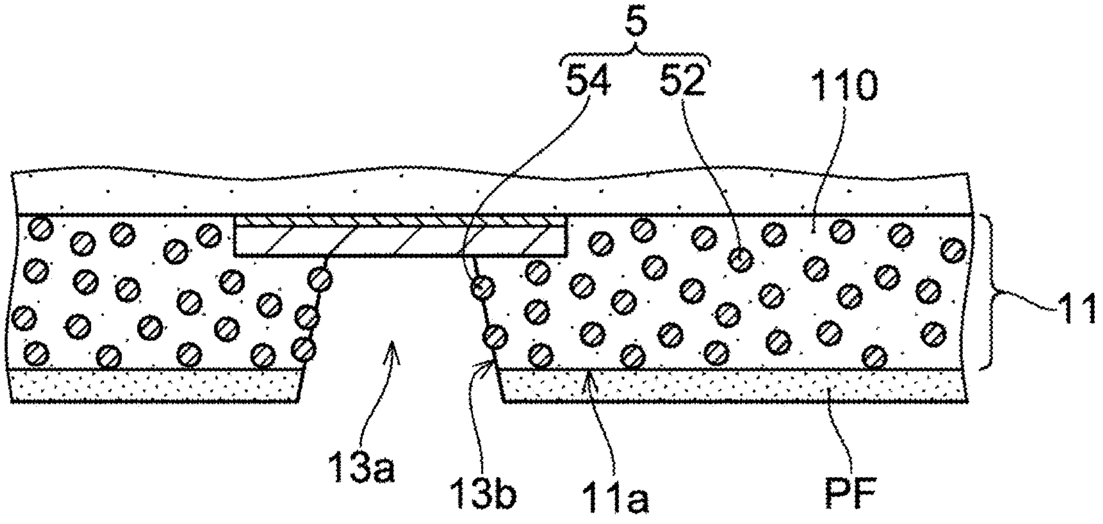
FIG. 4C is an enlarged partial cross-sectional view illustrating an example of a process for manufacturing a wiring substrate according to an embodiment of the present invention.

As illustrated in FIG. 4C, openings (13*a*) are formed at formation positions of the via conductors 13 (see FIG. 1) in the insulating layer 11 by irradiation with $CO_2$ laser or the like. FIG. 4C and FIGS. 4D-4I to be referenced below each illustrate an enlarged view of a state of a portion corresponding to a portion (IVC) of FIG. 4B after going through a process described with each drawing. The formation of the openings (13*a*) by irradiating with $CO_2$ laser or the like is performed while protecting the surface (11*a*) of the insulating layer 11 with the protective film (PF). Even when the resin 110 is scattered during laser irradiation, the scattered resin 110 is prevented from adhering to the surface (11*a*) of the insulating layer 11. Then, the openings (13*a*) penetrating the protective film (PF) and the insulating layer 11 are formed.

The inner wall surface (13*b*) of each of the openings (13*a*) is formed by the resin 110 and inorganic particles 54 that are among the inorganic particles 5 and protrude from the resin 110. By irradiating the insulating layer 11 with a laser, some of the second inorganic particles 52 embedded in the resin 110 protrude from the resin 110 and become the inorganic particles 54. The inorganic particles 54 forming the inner wall surface (13*b*) each include a portion protruding from the resin 110 and a portion embedded in the resin 110. In order to control a shape of the inner wall surface (13*b*), the inner wall surface (13*b*) is subjected to a predetermined treatment. By controlling conditions for treating the inner wall surface (13*b*), a size of unevenness of the inner wall surface (13*b*) is controlled. Preferably, the portions of the inorganic particles 54 that protrude from the resin 110 are selectively removed by the treatment.

Figure 4D:
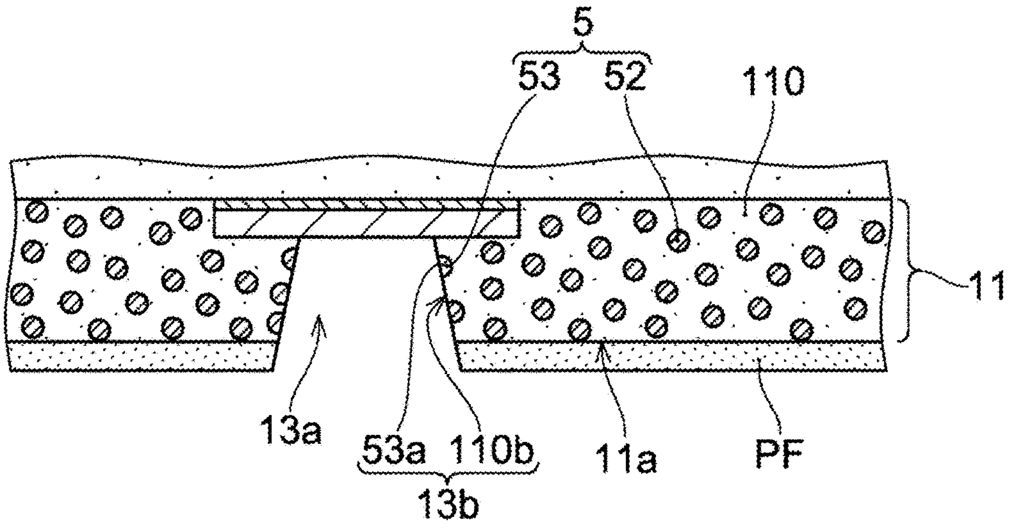
FIG. 4D is an enlarged partial cross-sectional view illustrating an example of a process for manufacturing a wiring substrate according to an embodiment of the present invention.

As a result, as illustrated in FIG. 4D, the third inorganic particles 53 having the flat parts (53*a*) are formed. For example, after the laser irradiation, the third inorganic particles 53 are formed by treating the inner wall surface (13*b*) of each of the openings (13*a*) with a chemical. For example, the inner wall surface (13*b*) is treated using an etching solution that has a higher etching rate for the inorganic particles 5 than for the resin 110. As an example, a permanganate solution is used.

Or, the third inorganic particles 53 may be formed by treating the inner wall surface (13*b*) with a plasma gas. By controlling conditions of a plasma treatment, the shape of the inner wall surface (13*b*) can be controlled. As some examples, the etching rate of the inorganic particles 5 and the etching rate of the resin 110 are controlled by adjusting conditions such as temperature, concentration, time, type and pressure of a plasma gas. For example, a plasma gas such as argon, methane tetrafluoride, a mixture of methane tetrafluoride and oxygen, or sulfur hexafluoride is used.

That is, some of the spherical second inorganic particles 52 protrude into the openings (13*a*) to become the inorganic particles 54 (see FIG. 4C) due to the formation of the openings (13*a*) by laser irradiation, and the protruding portions are cut flat by the appropriate treatment described above. As will be described later, when a metal film 121 (see FIG. 4E) as a seed layer is formed, for example by sputtering on the inner wall surface (13*b*) of each of the openings (13*a*) in a subsequent process, the protruding portions of the inorganic particles 54 may impede growth of the sputtering film. It may be possible that a continuous seed layer is not formed on the inner wall surface (13*b*). Or, it may be necessary to form a thick seed layer, making it impossible to form fine wirings.

In contrast, in the manufacturing of the wiring substrate 1 of the embodiment, the protruding portions of the inorganic particles 54 are removed, and the third inorganic particles 53 having the flat parts (53*a*) are formed. The flat parts (53*a*) are flat surfaces. The inner wall surface (13*b*) of each of the openings (13*a*) is formed by the flat parts (53*a*) of the third inorganic particles 53 and the surface (110*b*) of the resin 110 exposed in the each of the openings (13*a*). The flat parts (53*a*) forming the inner wall surface (13*b*) and the surface (110*b*) of the resin 110 are substantially flush with each other. No unevenness is formed on the inner wall surface (13*b*). A smooth inner wall surface (13*b*) is obtained.

The treatment of the inner wall surface (13*b*) is performed while the surface (11*a*) of the insulating layer 11 is protected by the protective film (PF). Therefore, the surface (11*a*) of the insulating layer 11 is unlikely to be eroded, for example, by a chemical or a plasma gas during the treatment of the inner wall surface (13*b*).

After treating the inner wall surface (13*b*) of each of the openings (13*a*), insides of the openings (13*a*) are cleaned when necessary. By cleaning the insides of the openings (13*a*), resin residues generated during the formation of the openings (13*a*) are removed. That is, the cleaning can include a desmear treatment. The cleaning of the insides of the openings (13*a*) is performed, for example, by a plasma treatment. That is, the cleaning may be performed with a dry process. The surface (11*a*) of the insulating layer 11 is covered by the protective film (PF), and thus is not affected by the plasma treatment. Therefore, at this point, no unevenness is formed on the surface (11*a*) of the insulating layer 11. The surface (11*a*) is not roughened. When the insides of the openings (13*a*) are sufficiently cleaned by the treatment of the inner wall surface (13*b*) in the preceding process, the cleaning of the insides of the openings (13*a*) after the treatment of the inner wall surface (13*b*) can be omitted.

After the cleaning of the insides of the openings (13*a*) (or after the treatment of the inner wall surface (13*b*) when the cleaning of the insides of the openings (13*a*) is omitted), the protective film (PF) is removed from the insulating layer 11.

Figure 4E:
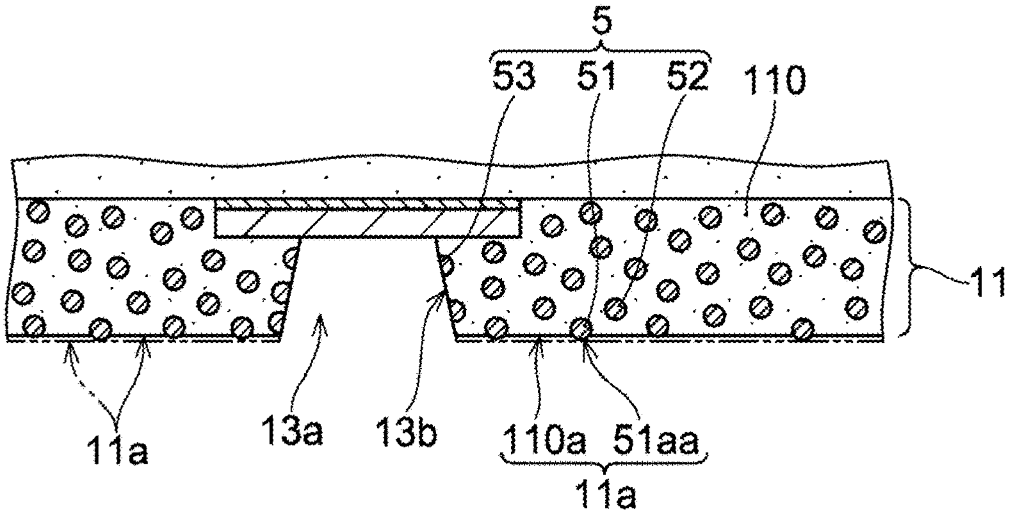
FIG. 4E is an enlarged partial cross-sectional view illustrating an example of a process for manufacturing a wiring substrate according to an embodiment of the present invention.

As illustrated in FIG. 4E, the surface (11*a*) of the insulating layer 11 is exposed. As described above, the surface (11*a*) of the insulating layer 11 is not affected by the chemical or plasma gas used for cleaning the insides of the openings (13*a*) or treating the inner wall surface (13*b*). Therefore, the surface (11*a*) after the removal of the protective film (PF) is flat, as illustrated by a two-dot chain line in FIG. 4E. The flat surface (11*a*) is cleaned. As an example, the surface (11*a*) is dry etched. The dry etching is performed, for example, by sputtering using an argon gas (argon sputtering). By cleaning by dry etching or the like, the resin 110 forming the insulating layer 11 is removed by about 20 nm near the surface (11*a*). A release agent and/or an adhesive (not illustrated) interposed between the protective film (PF) (see FIG. 4D) and the insulating layer 11 may be removed together with the resin 110 near the surface (11*a*). In dry etching such as argon sputtering, the resin 110 near the surface (11*a*) is selectively removed, that is, at a faster rate than the inorganic particles 5 (second inorganic particles 52) near the surface (11*a*).

A thickness of the resin 110 is reduced by the cleaning. As a result, some of the inorganic particles 5 (second inorganic particles 52) existing near the surface (11*a*) are partially exposed from the surface (lower surface) (110*a*) of the resin 110. Some of the second inorganic particles 52 embedded in the resin 110 are exposed from the surface (110*a*) of the resin 110 and become the first inorganic particles 51. That is, the first inorganic particles 51 are formed from the second inorganic particles 52. The first inorganic particles 51 and the second inorganic particles 52 have substantially the same shape and can each have a substantially spherical shape. The first inorganic particles 51 are each formed of a portion protruding from the resin 110 and a portion embedded in the resin 110. The surface (11*a*) of the insulating layer 11 is formed by the surface (110*a*) of the resin 110 and the exposed surfaces (51*aa*) of the first inorganic particles 51 from the surface (110*a*) of the resin 110. The exposed surfaces (51*aa*) are exposed from the resin 110 by cleaning by dry etching or the like. The surface (11*a*) of the insulating layer 11 is not roughened. Therefore, substantially no recesses are formed on the surface (11*a*).

Figure 4F:
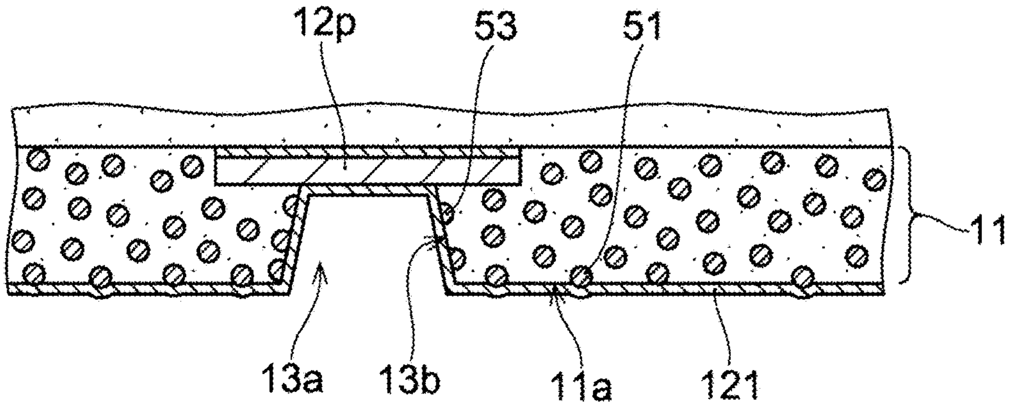
FIG. 4F is an enlarged partial cross-sectional view illustrating an example of a process for manufacturing a wiring substrate according to an embodiment of the present invention.

As illustrated in FIG. 4F, the metal film 121 formed of, for example, copper or nickel or the like is formed by sputtering or electroless plating on the inner wall surface (13*b*) of each of the openings (13*a*), on the exposed surface of each of the component mounting pads (12*p*), and on the surface (11*a*) of the insulating layer 11. The metal film 121 functions as a seed layer when a metal film 122 (see FIG. 4H) is formed by electrolytic plating in a subsequent process. When the metal film 121 is formed by sputtering, it may be possible that a metal film 121 exhibiting high adhesion to the insulating layer 11 is formed. A part of the metal film 121 can become the first layer (12α) (see FIG. 2) that forms the conductor layer 12 formed on the insulating layer 11. The protruding portions of the first inorganic particles 51 from the surface (11*a*) of the insulating layer 11 are covered by the metal film 121. The exposed surfaces of the third inorganic particles 53 on the inner wall surface (13*b*) of each of the openings (13*a*) are also covered by the metal film 121.

As described above, substantially no recesses are formed on the surface (11*a*) of the insulating layer 11. In addition, also no unevenness is formed on the inner wall surface (13*b*) of each of the openings (13*a*), and the inner wall surface (13*b*) is substantially a smooth surface. Therefore, a thin continuous metal film 121 can be formed by sputtering. For example, a metal film 121 with a thickness of 0.05 μm or more and less than 0.5 μm is formed. When the thickness of the metal film 121 is less than 0.5 μm, it may be possible that fine wirings can be formed on the insulating layer 11.

Figure 4G:
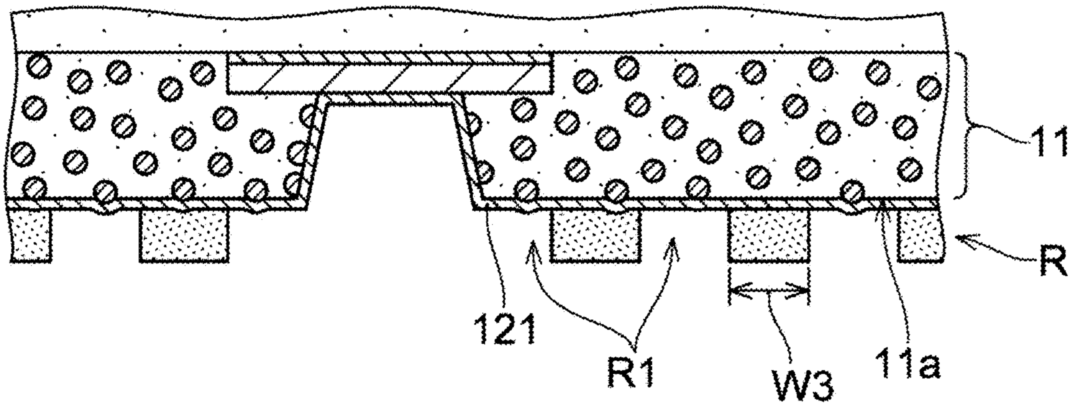
FIG. 4G is an enlarged partial cross-sectional view illustrating an example of a process for manufacturing a wiring substrate according to an embodiment of the present invention.

As illustrated in FIG. 4G, a plating resist (R) having openings (R1) is provided on the metal film 121. The plating resist (R) is formed, for example, by laminating a dry film on the metal film 121, and the openings (R1) are formed, for example, by photolithography. The openings (R1) are formed in patterns corresponding to the conductor patterns to be included in a conductor layer 12 (see FIG. 4J) formed on the insulating layer 11. Wirings such as the wirings (12*w*) (see FIG. 2) included in the conductor layer 12, as described above, may have wiring widths of 3 μm or less. The openings (R1) are formed to have opening widths corresponding to wiring widths of conductor patterns such as the wirings (12*w*) to be formed in the openings (R1). Further, as described above, the wirings of the conductor layer 12 may have an aspect ratio of 2.0 or more and 4.0 or less. Therefore, preferably, a plating resist (R) is formed having a thickness (height) equal to or larger than a thickness (height) of wirings that satisfy the aspect ratio that the wirings to be formed should have.

During the formation of the plating resist (R), when the surface (11*a*) of the insulating layer 11 have recesses, air due to the recesses is likely to be trapped between the plating resist (R) and the metal film 121. However, the surface (11*a*) of the insulating layer 11 in the wiring substrate 1 of the embodiment has substantially no recesses. Therefore, a surface of the metal film 121 also has substantially no recesses. Therefore, air is unlikely to remain between the plating resist (R) and the metal film 121. Further, a contact area between the plating resist (R) and the metal film 121 is large. Even when a width (W3) of the plating resist (R) between the openings (R1) is, for example, about 1-3 μm, which can be the minimum inter-wiring distance of the conductor layer 12, a plating resist (R) that is unlikely to peel off from the metal film 121 can be formed.

Figure 4H:
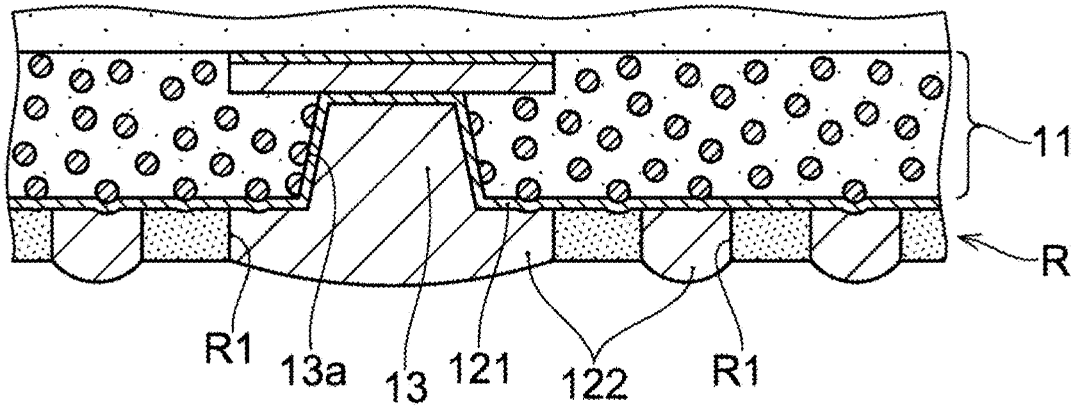
FIG. 4H is an enlarged partial cross-sectional view illustrating an example of a process for manufacturing a wiring substrate according to an embodiment of the present invention.

As illustrated in FIG. 4H, the metal film 122 formed of, for example, copper or nickel or the like is formed in the openings (R1) of the plating resist (R) by electrolytic plating using the metal film 121 as a power feeding layer. A part of the metal film 122 can become the second layer (12β) (see FIG. 2) that forms the conductor layer 12 formed on the insulating layer 11. Via conductors 13 are formed in the openings (13*a*) of the insulating layer 11. As in the example of FIG. 4H, the metal film 122 may be formed to completely fill the openings (R1) and further have a curved surface protruding beyond a surface (lower surface) of the plating resist (R). It may be possible that wirings having desired thicknesses and aspect ratios may be more reliably formed.

Figure 4I:
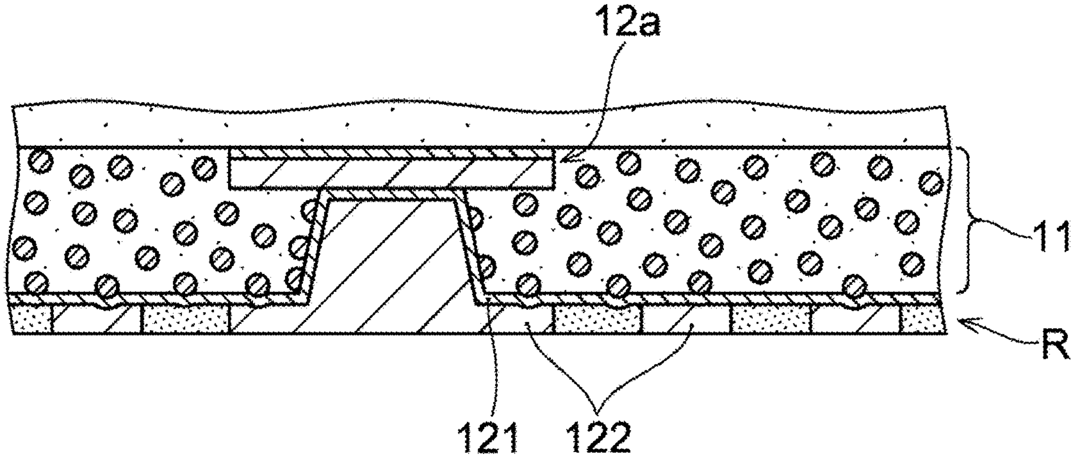
FIG. 4I is an enlarged partial cross-sectional view illustrating an example of a process for manufacturing a wiring substrate according to an embodiment of the present invention.

As illustrated in FIG. 4I, a part on a lower surface (surface on the opposite side with respect to the conductor layer (12*a*)) side of the metal film 122 is removed by polishing. At least a protruding portion of the metal film 122 from a lower surface of the plating resist (R) is removed. The metal film 122 is polished until a total thickness of the metal film 121 and the metal film 122 reaches a thickness required for the conductor layer 12 (see FIG. 4J) formed on the insulating layer 11, for example, a thickness of 7 μm or less. As in the example of FIG. 4I, a lower-surface side part of the plating resist (R) may also be removed together with a part of the metal film 122. The polishing of the metal film 122 is performed, for example, using any method such as chemical mechanical polishing (CMP). As a result of the polishing, the lower surface of the metal film 122 can have an arithmetic mean roughness of 0.3 μm or less.

After the polishing the metal film 122, the plating resist (R) is removed. Further, a portion of the metal film 121 that is not covered by the metal film 122 is removed, for example, by quick etching or the like.

Figure 4J:
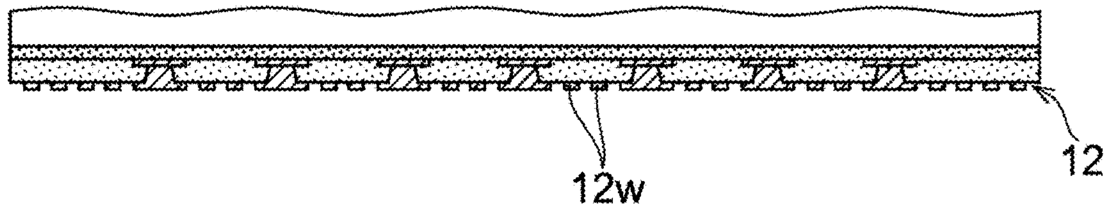
FIG. 4J is a cross-sectional view illustrating an example of a process for manufacturing a wiring substrate according to an embodiment of the present invention.

As illustrated in FIG. 4J, the conductor layer 12 including predetermined conductor patterns such as the wirings (12*w*) separated from each other is obtained. In FIG. 4J, similar to FIG. 1, the conductor layer 12 is illustrated as having only one layer. However, the conductor layer 12 is formed of the metal film 122 illustrated in FIG. 4I and the metal film 121 after a portion thereof is removed from the state of FIG. 4I as described above.

Figure 4K:
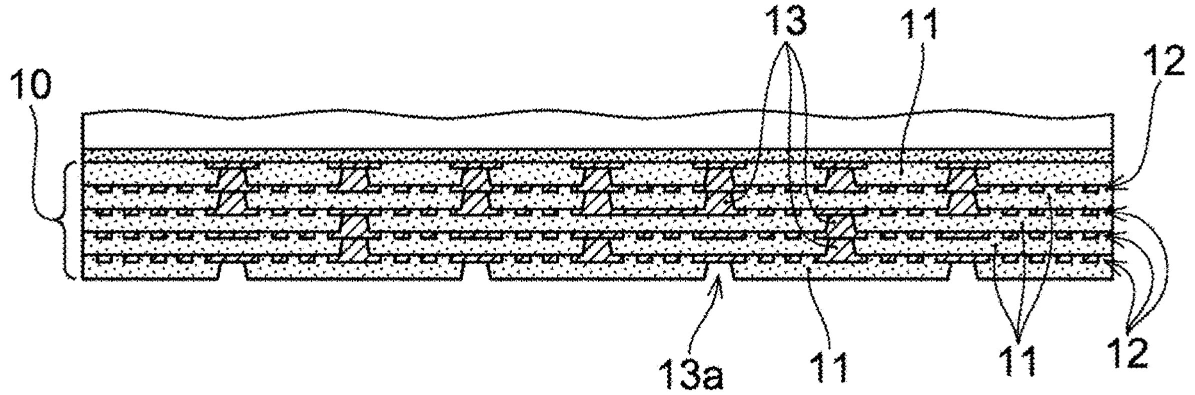
FIG. 4K is a cross-sectional view illustrating an example of a process for manufacturing a wiring substrate according to an embodiment of the present invention.

As illustrated in FIG. 4K, on the insulating layer 11 and conductor layer 12 formed through the processes up to FIG. 4J, three more sets of the insulating layer 11 and conductor layer 12, as well as via conductors 13, are further formed using a method similar to the method described with reference to FIGS. 4B-4I. Then, on the laminate of the conductor layers 12 and insulating layers 11 formed in this way, an insulating layer 11 is further laminated using the same method as the other insulating layers 11, and openings (13*a*) penetrating the insulating layer 11 are formed by laser irradiation or the like. The first build-up part 10 is completed.

Figure 4L:
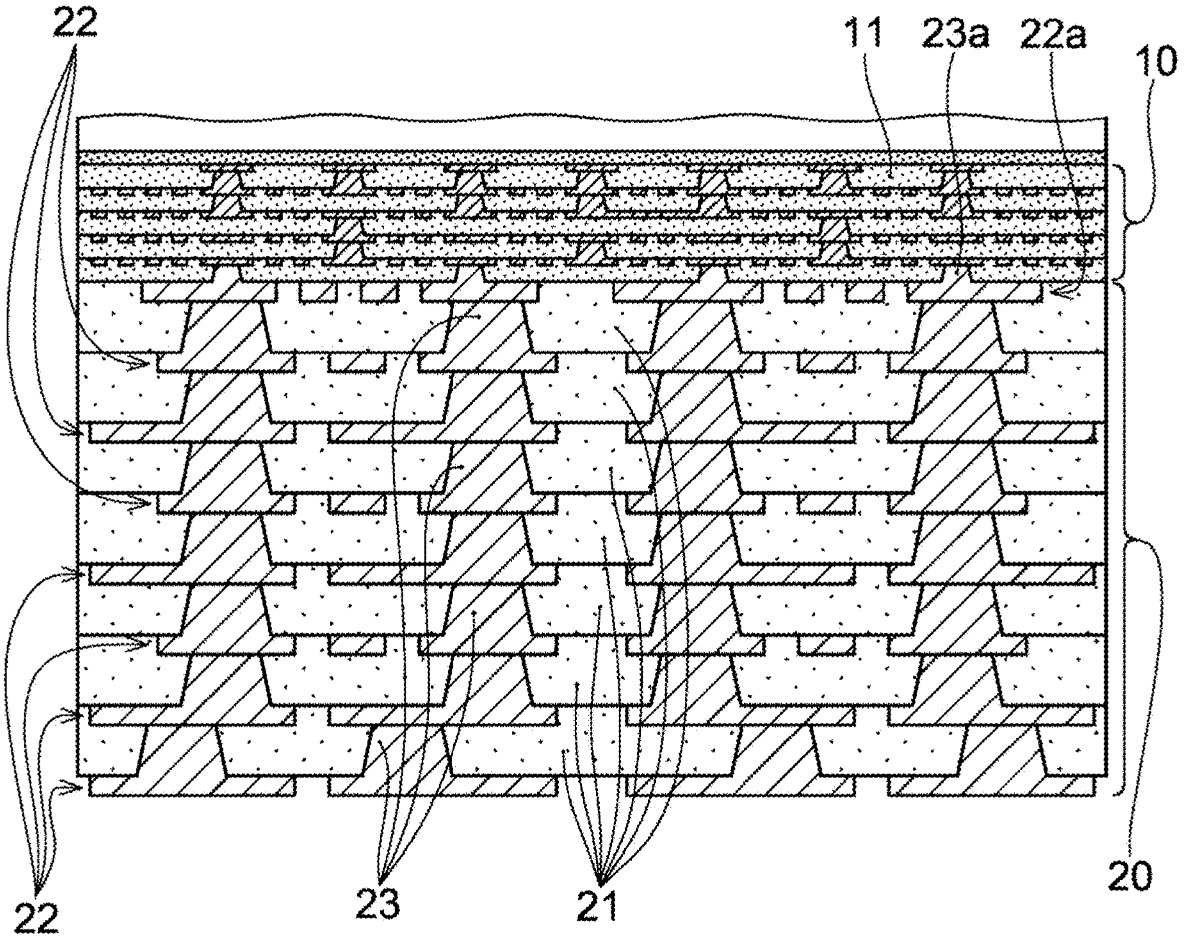
FIG. 4L is a cross-sectional view illustrating an example of a process for manufacturing a wiring substrate according to an embodiment of the present invention.

As illustrated in FIG. 4L, on the lower side of the first build-up part 10, the conductor layer (22*a*) and the via conductors (23*a*) are formed. Further, by repeating formation of an insulating layer 21, a conductor layer 22, and via conductors 23, the second build-up part 20 is formed. The conductor layer (22*a*), the conductor layers 22, the via conductors (23*a*), and the via conductors 23 are formed using any method for forming conductor layers and via conductors, such as a semi-additive method. The insulating layers 21 each can be formed by laminating and thermocompression bonding a film-like resin, similar to the method for forming the insulating layers 11.

Figure 4M:
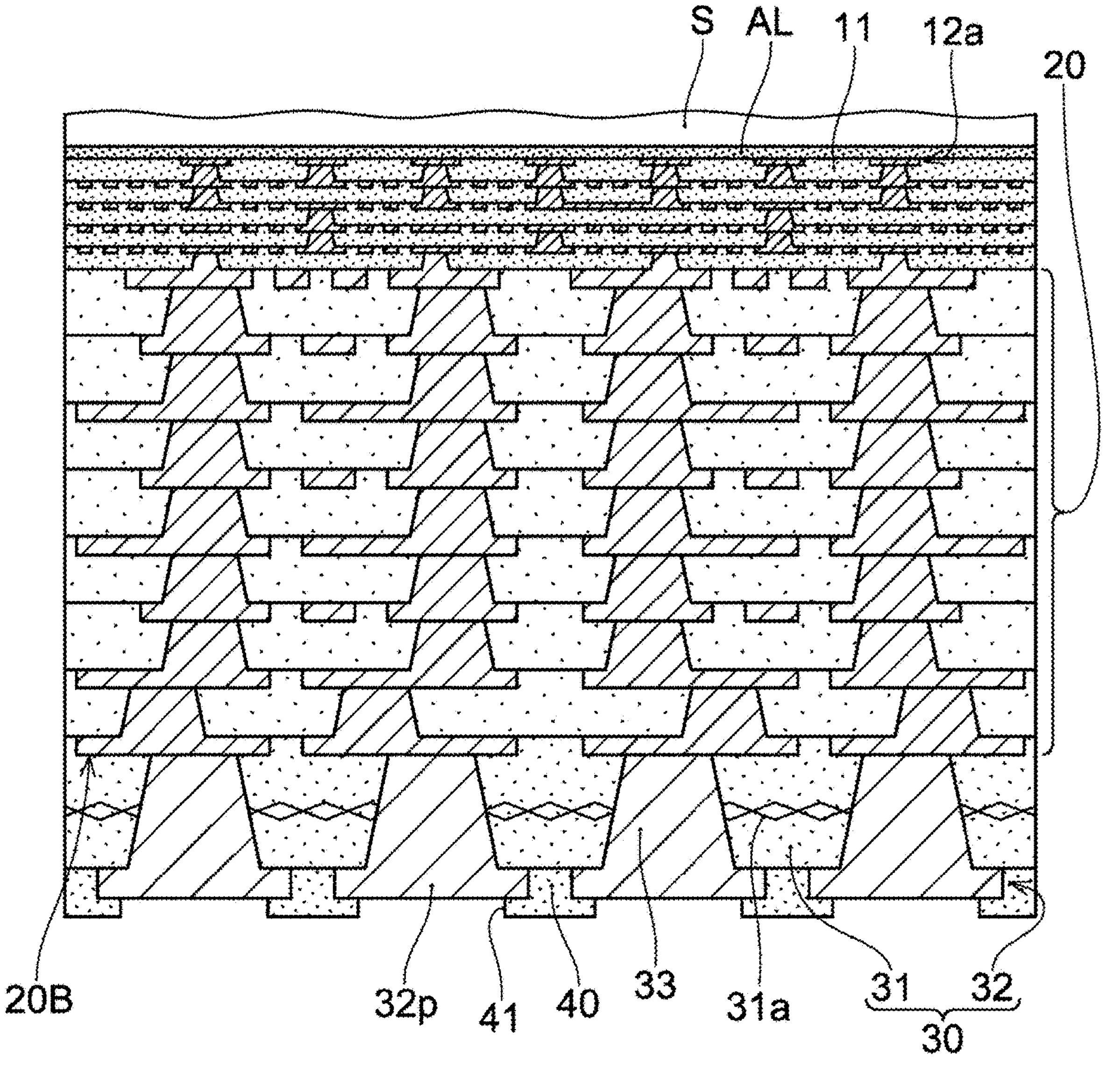
FIG. 4M is a cross-sectional view illustrating an example of a process for manufacturing a wiring substrate according to an embodiment of the present invention.

As illustrated in FIG. 4M, on the surface (second surface (20B)) of the second build-up part 20 on the opposite side with respect to the support substrate(S) side, the insulating layer 31, the conductor layer 32, and the via conductors 33 penetrating the insulating layer 31, of the third build-up part 30, are formed. The insulating layer 31 in FIG. 4M is formed by laminating and thermocompression bonding a prepreg containing an insulating resin such as an epoxy resin impregnated with a core material (31*a*) formed of a glass fiber or the like. Similar to the insulating layers 21, the insulating layer 31 may be formed by thermocompression bonding of a film-like resin. Similar to the method for forming the conductor layers 22 and via conductors 23, the conductor layer 32 and via conductors 33 may be formed, for example, using a semi-additive method, or using any other method for forming a conductor layer such as a subtractive method. The formation of the third build-up part 30 is completed.

Further, the solder resist 40 is formed by forming a photosensitive epoxy resin film or a polyimide resin film on the surfaces of the insulating layer 31 and the conductor layer 32. Then, the openings 41 defining the conductor pads (32*p*) are formed by photolithography.

After that, the support substrate(S) is removed. For example, laser is irradiated onto the adhesive layer (AL), and after the adhesive layer (AL) is softened, the support substrate(S) is peeled off from the conductor layer (12*a*) and the insulating layer 11. The upper surface of the conductor layer (12*a*) and the upper surface of the insulating layer 11 are exposed. When any adhesive layer (AL) remains, the remaining adhesive layer (AL) is removed using an appropriate solvent. The wiring substrate 1 illustrated in FIG. 1 is completed.

The wiring substrate of the embodiment is not limited to those having the structures illustrated in the drawings and those having the structures, shapes, and materials exemplified herein. As described above, the build-up parts included in the wiring substrate of the embodiment can each have any number of insulating layers and conductor layers. Further, the wiring substrate of the present embodiment does not necessarily include the third build-up part. It is also possible that the outermost insulating layer and conductor layer on the opposite side with respect to the component mounting surface of the wiring substrate of the embodiment are not respectively formed thicker than the insulating layers and conductor layers in the second build-up part, and it is also possible that the outermost insulating layer on the opposite side with respect to the component mounting surface of the wiring substrate does not include a core material. It is also possible that the inorganic particles contained in the insulating layers of the first build-up part do not include the inorganic particles that form the inner wall surfaces of the openings for forming the via conductors, such as the third inorganic particles.

Japanese Patent Application Laid-Open Publication No. 2021-19061 describes a printed wiring board that includes an interlayer insulating layer using a mixture of a thermosetting resin and an inorganic filler, and a seed layer and a plating layer formed on the interlayer insulating layer. A surface of the interlayer insulating layer and side and bottom surfaces of vias provided in the interlayer insulating layer have recesses formed by preferentially etching the inorganic filler.

In the printed wiring board described in Japanese Patent Application Laid-Open Publication No. 2021-19061, since the recesses are formed on the surface of the interlayer insulating layer and the exposed surfaces in the vias, it is thought difficult to form an uninterrupted continuous seed layer in the recesses. To form a continuous seed layer that completely covers the surface of the insulating layer including the recesses and covers the exposed surfaces in the vias, a thick seed layer is formed. However, when the seed layer is thick, it is difficult to provide fine wiring patterns with high insulation between adjacent patterns.

A wiring substrate according to an embodiment of the present invention has a first surface and a second surface on opposite side with respect to the first surface and includes: a first build-up part that includes laminated insulating layer and conductor layer; and a second build-up part that includes laminated insulating layer and conductor layer. The first build-up part is laminated on the first surface side of the second build-up part. A minimum width of wirings included in the conductor layer of the first build-up part is smaller than a minimum width of wirings included in the conductor layer of the second build-up part. A minimum inter-wiring distance of the wirings included in the conductor layer of the first build-up part is smaller than a minimum inter-wiring distance of the wirings included in the conductor layer of the second build-up part. The insulating layer of the first build-up part contains a resin and inorganic particles. The inorganic particles include first inorganic particles that are partially embedded in the resin and second inorganic particles that are completely embedded in the resin. The first inorganic particles are each formed of a first portion protruding from the resin and a second portion embedded in the resin. A surface of the insulating layer of the first build-up part covered by the conductor layer of the first build-up part is formed of a surface of the resin and exposed surfaces of the first portions exposed from the resin.

According to an embodiment of the present invention, it may be possible that a wiring substrate including multiple conductor layers with different wiring densities can be provided with fine wirings that are unlikely to cause a short circuit failure between adjacent wirings.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a first build-up part comprising an insulating layer and a conductor layer; and a second build-up part laminated on the first build-up part and comprising an insulating layer and a conductor layer such that a minimum width of wirings in the conductor layer of the first build-up part is smaller than a minimum width of wirings in the conductor layer of the second build-up part and that a minimum inter-wiring distance of the wirings in the conductor layer of the first build-up part is smaller than a minimum inter-wiring distance of the wirings in the conductor layer of the second build-up part, wherein the insulating layer in the first build-up part includes resin and inorganic particles comprising first inorganic particles partially embedded in the resin and second inorganic particles completely embedded in the resin such that the first inorganic particles have first portions protruding from the resin and second portions embedded in the resin, respectively, and that a ratio of a volume of the first portions to a volume of the first inorganic particles is larger than 0 and equal to or less than 0.2, the first build-up part is formed such that the insulating layer has a surface covered by the conductor layer and including a surface of the resin and exposed surfaces of the first portions exposed from the resin and that the conductor layer includes a seed layer comprising a sputtering film and an electrolytic plating film layer formed on a surface of the seed layer, and the second build-up part is formed such that the conductor layer of the second build-up part includes an electroless plating film and an electrolytic plating film formed on the electroless plating film.

2. The wiring substrate according to claim 1, wherein the first build-up part is formed such that the minimum width of the wirings in the conductor layer is 3 μm or less and that the minimum inter-wiring distance of the wirings in the conductor layer is 3 μm or less.

3. The wiring substrate according to claim 2, wherein the first build-up part is formed such that an aspect ratio of the wirings in the conductor layer is in a range of 2.0 to 4.0.

4. The wiring substrate according to claim 2, wherein the first build-up part is formed such that the conductor layer has a polished surface.

5. The wiring substrate according to claim 1, wherein the first build-up part is formed such that an aspect ratio of the wirings in the conductor layer is in a range of 2.0 to 4.0.

6. The wiring substrate according to claim 1, wherein the first build-up part is formed such that the conductor layer has a polished surface.

7. The wiring substrate according to claim 1, further comprising:

a third build-up part laminated on the second build-up part on an opposite side with respect to the first build-up part and comprising an insulating layer, a conductor layer, and a via conductor.

8. The wiring substrate according to claim 7, wherein the third build-up part is formed such that the insulating layer includes a core material.

9. The wiring substrate according to claim 8, wherein the core material is a glass fiber.

10. The wiring substrate according to claim 1, wherein the first build-up part has a component mounting surface configured to mount a component.

11. The wiring substrate according to claim 1, wherein the first build-up part is formed such that a ratio of a volume of the first portions to a volume of the first inorganic particles is larger than 0 and equal to or less than 0.1.

12. The wiring substrate according to claim 1, wherein the first build-up part is formed such that an arithmetic mean roughness Ra of the surface of the insulating layer is less than 0.08 μm.

13. The wiring substrate according to claim 1, wherein the first build-up part includes a via conductor formed in an opening penetrating through the insulating layer, the inorganic particles include third inorganic particles having flat parts and forming an inner wall surface of the opening such that the inner wall surface includes flat parts of the third inorganic particles and the resin.

14. The wiring substrate according to claim 13, wherein the inner wall surface has an arithmetic mean roughness Ra of 1.0 μm or less.

15. The wiring substrate according to claim 13, wherein each of the third inorganic particles has a spherical segment shape.

16. The wiring substrate according to claim 1, wherein the first build-up part includes a via conductor penetrating though the insulating layer of the first build-up part such that the conductor layer and the via conductor include the seed layer and the electrolytic plating film layer and that the seed layer has a thickness of less than 0.5 μm.

17. The wiring substrate according to claim 1, wherein the first build-up part includes a via conductor penetrating through the insulating layer of the first build-up part such that the via conductor has a shape that is reduced in diameter away from the second build-up part.

18. The wiring substrate according to claim 1, wherein the first build-up part is formed such that the surface of the insulating layer in the first build-up part is not roughened.

19. The wiring substrate according to claim 1, wherein the first build-up part is formed such that the surface of the insulating layer in the first build-up part has substantially no recesses.

20. The wiring substrate according to claim 1, wherein the second build-up part is formed such that the insulating layer of the second build-up part includes inorganic particles and that a maximum particle size of the inorganic particles in the insulating layer of the first build-up part is smaller than a maximum particle size of the inorganic particles in the insulating layer of the second build-up part.

* * * * *